(12) United States Patent
Shimoe

(10) Patent No.: US 6,372,985 B1
(45) Date of Patent: Apr. 16, 2002

(54) PACKAGE FOR ELECTRONIC COMPONENTS

(75) Inventor: Kazunobu Shimoe, Kanazawa (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/557,707

(22) Filed: Apr. 25, 2000

(30) Foreign Application Priority Data

May 6, 1999 (JP) .......................................... 11-126050

(51) Int. Cl.[7] .......................... H01L 23/02; H01L 23/48
(52) U.S. Cl. ...................... 174/52.4; 257/693; 174/260; 174/261
(58) Field of Search .............................. 174/52.3, 52.4, 174/255, 260, 261; 361/760, 764, 728, 729, 730, 731; 257/692, 693, 698, 704; 439/65, 74

(56) References Cited

U.S. PATENT DOCUMENTS

| | | | | |
|---|---|---|---|---|
| 4,357,647 A | * | 11/1982 | Hadersbeck et al. | ........ 361/400 |
| 5,369,551 A | * | 11/1994 | Gore et al. | ................ 361/767 |
| 5,455,385 A | * | 10/1995 | Newton et al. | ............ 174/52.4 |
| 5,864,092 A | * | 1/1999 | Gore et al. | ................. 174/52.4 |

OTHER PUBLICATIONS

Article Entitled "Ultra Compact Saw Filter" by Fujitsu Limited dated Dec. 1997.

* cited by examiner

Primary Examiner—Dean A. Reichard
Assistant Examiner—Carmelo Oliva
(74) Attorney, Agent, or Firm—Keating & Bennett, LLP

(57) ABSTRACT

A package for electronic components includes a base substrate having at least one recess on a side surface thereof, the base substrate having electrodes on an upper surface and a bottom surface thereof and a conductive pattern arranged in the recess such that the electrode on the upper surface is electrically connected to the electrode on the bottom surface through the conductive pattern. A side wall of the package has a through-hole which provides a space for receiving an electronic element. The side wall has at least one recess on a side surface thereof and is provided on the base substrate such that the recess of the side wall is connected to the recess of the base substrate so as to provide a communicating recess. The recess of the base substrate has a cross-sectional area that is substantially larger than the recess of the side wall in a direction that is substantially perpendicular to the base substrate.

19 Claims, 13 Drawing Sheets

PACKAGE FOR ELECTRONIC COMPONENTS

BACKGROUND OF THE INVENTION

1. Field of the Invention

The present invention relates to a package for electronic components and also relates to electronic components including such a package. The present invention particularly relates to a ceramic package for surface-mount type electronic components and electronic components using such a ceramic package.

2. Description of the Related Art

A conventional package for an electronic component includes wiring layers disposed in recesses provided on the side surfaces of a substrate (castellation), as well as, via-holes arranged along the direction of thickness of the substrate in order to electrically connect electrodes located on an upper surface of a base substrate and electrodes disposed on the bottom surface of the base substrate.

FIGS. 19 to 21 show common structures of a conventional ceramic package provided with recesses on the side surfaces of a substrate. FIGS. 19 and 20 show a disassembled perspective top view and a perspective bottom view of the conventional package, respectively, while FIG. 21 shows a partially enlarged perspective view of the package in FIG. 20. The package 21 is composed of a base substrate 22 and a side wall 23. The base substrate 22 and the side wall 23 include layer or a plurality of layers of a ceramic insulation substrate made of, for example, $Al_2O_3$. An electrode 24 (the area surrounded by a broken line in FIG. 19) for electrically connecting device elements (not shown) to the package 21 is provided on the element mounting surface for mounting device elements, or on the upper surface of the base substrate 22. External electrode terminals 25 for electrically connecting the package 21 to a mounting substrate are formed on the bottom surface of the base substrate 22. Recesses 26 and 30 communicating with the bottom surface of the base substrate 22 are provided at the side surfaces of the side wall 23 and base substrate 22, and wiring layers 27 are disposed on the side surfaces of the recesses 26 provided on the base substrate 22. The recesses 26 and 30 have the same cross-sectional shape as each other. The electrode 24 is electrically connected to the external electrode terminals 25 through lead patterns 28 (the area outside of the area surrounded by the broken line in FIG. 19), which abut the electrode and extend outward, and the wiring layers 27 are disposed in the recesses 26. Chamfers 31 and 31 are provided at the corners of the base substrate 22 and side wall 23 in order to prevent them from being chipped.

The method for manufacturing the package as described above will be described hereinafter. Through holes which define the recesses 26 and the chamfers 31 are formed on a mother sheet of a ceramic green sheet provided for forming the base substrate 22, followed by depositing a metal film for forming the wiring layers 27 in the recesses 26 and on the electrodes 24, 28 and 25. Subsequently, the area surrounded by the side wall 23 is punched, and through holes defining the recesses 30 and chamfers 31 are formed through a mother sheet of a ceramic green sheet for forming the side wall 23. These ceramic green sheets for forming the base substrates and side walls are laminated, press-bonded and fired in the next step. Then, the surfaces of the electrodes 24 and 25, and the surfaces of the wiring layers 27 are plated. Finally, the laminated green sheet is cut along the lines passing through the centers of the through holes that define the recesses and chamfers to divide into a lot of substrates, thereby completing the package 21.

FIG. 22 is a cross-sectional view showing the configuration when an electronic component 35 including the package 21 in which an electronic device element is accommodated is mounted on a substrate. The package 21 in FIG. 22 corresponds to a cross-section of the package in FIG. 20 on the surface Y. An electronic device element 32 such as an elastic surface wave element or a semiconductor element is mounted on the element mounting surface of the package 21 as shown in the drawing, and the package 21 is airtight-sealed with a lid 29 made of, for example, a metal. The electronic component formed as described above is mounted on the surface of a printed circuit board 34 using a solder for mounting. In mounting the electronic component, solder fillets 33 are formed by a reflow method using a solder paste. The solder fillets 33 are provided for electrically and mechanically connecting the electronic component 35 to the printed circuit board.

However, the conventional package 21 for an electronic component experienced the problems as described below. While the thickness $\underline{W}$ of the side wall 23 of the package is reduced as the electronic component is miniaturized, the thickness $\underline{W}$ of the side wall 23 as a sealing width should be ensured to a certain extent for airtight-sealing of the package using the lid 29. Since the thickness $\underline{W}$ of the side wall 23 turns out to be a minimum ($\underline{Wmin}$) particularly at the portions where the recesses 26 and 30 are formed, the recesses 26 and 30 are required to be as small as possible for providing a certain minimum required sealing width.

A thicker electrical continuity passage can be formed, on the other hand, between the external electrode terminal 25 and the electrode 24 on the element mounting surface as the contact area between the solder fillet 33 and the wiring layer 27 is wider, thereby impedance $\underline{Z}$, for example resistance, between the electrodes is reduced. In addition, mechanical strength such as bonding strength and bending strength can be enhanced as the contact area between the solder fillet 33 and the wiring layer 27 is wider. Accordingly, the recesses 26 and 30 should be formed to be as large as possible, in order to increase the contact area between the solder fillet 33 and the wiring layer 27, or to ensure a good electrical and mechanical continuity between the element and the printed circuit board.

SUMMARY OF THE INVENTION

In order to overcome the problems described above, preferred embodiments of the present invention provide a package for electronic components having excellent electrical and mechanical continuity with a printed circuit board and being highly airtight, and electronic components using the same as a surface-mount type electronic component in which an electronic device element is accommodated in the package.

According to a preferred embodiment of the present invention, a package for electronic components includes a base substrate and a side wall in which recesses communicating with the bottom surface of the base substrate are provided on the base substrate and the side wall, and in which electrodes on the bottom surface of the base substrate are electrically connected to electrodes on the element mounting surface defining an upper surface of the base substrate though wiring layers disposed on a portion of the recesses, wherein the recesses are arranged on the base substrate to have a cross-sectional area that is wider than the cross-sectional area of the recesses disposed on the side wall.

When the recesses on the base substrate have a wider cross-sectional area than the cross-sectional area of the recesses on the side wall standing on the base substrate among the recesses on the base substrate and on the side wall, or when the recesses on the side wall are smaller and the recesses on the base substrate are larger, the thickness of the side wall of the package defining a sealing width can be ensured to a certain extent even at its narrowest portion, besides maintaining a sufficient a contact area between the wiring layer and solder fillets so as to ensure electrical continuity between the electrodes on the bottom surface of the base electrode and the electrodes on the element mounting surface. Consequently, excellent electrical and mechanical continuity between the electronic component and the printed circuit board are achieved while maintaining the package airtight.

The recesses may be also provided at the corners of the package. The wiring layer may be provided on the side surfaces of the recesses on the base substrate, and also at the upper portions of the recesses, or at the bottom portions of the material constituting the side wall. When the area of the wiring layer is enlarged as described above, a wider contact area between the wiring layer and the solder fillet can be ensured to further improve the electrical and mechanical continuity between the package and base substrate.

According to this unique structure and arrangement, the recesses on the base substrate preferably have a larger cross-sectional area than the cross-sectional area of the recesses on the side wall standing on the base substrate. Accordingly, the thickness of the side wall as a sealing width of the cap can be ensured to a certain extent even at the narrowest portion, while sufficiently ensuring the contact area between the wiring layer and the solder fillet for electrically connecting the electrodes on the bottom surface of the base substrate to the electrodes on the element mounting surface. Consequently, excellent electrical and mechanical continuity between the electronic component and the printed circuit board is ensured while keeping the package airtight to prevent the electrical characteristics of the electronic device element from being deteriorated.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
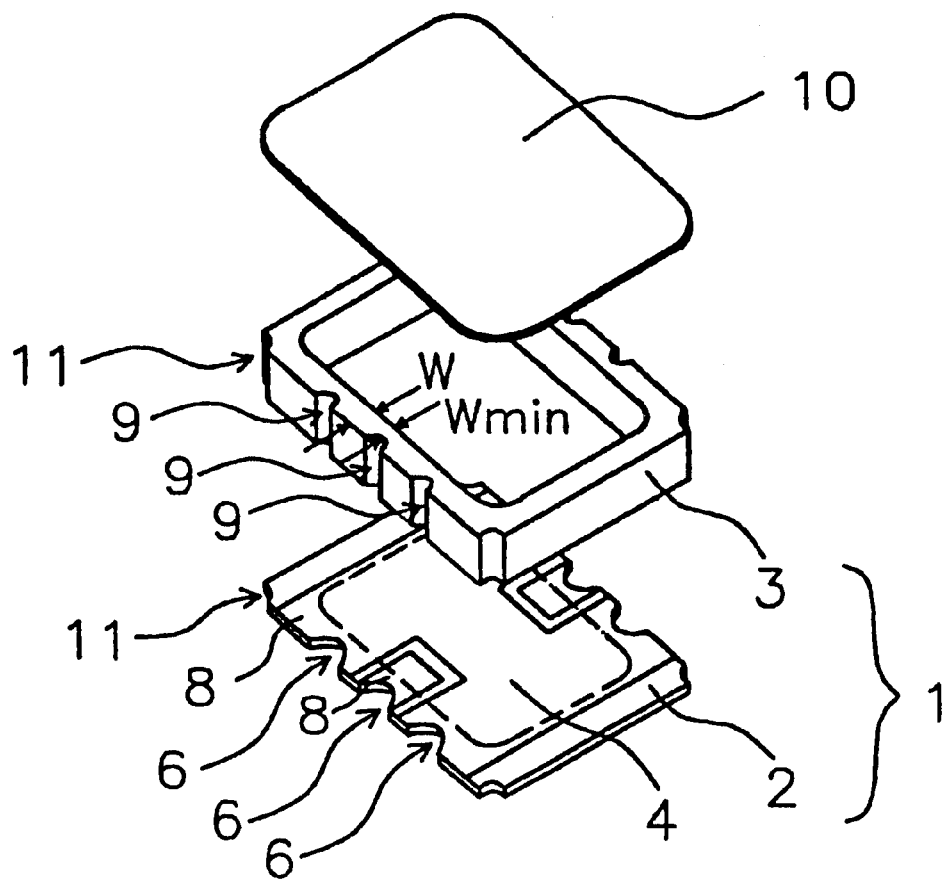
FIG. 1 shows a disassembled perspective top view of the package for electronic components according to one preferred embodiment of the present invention.
Figure 2:
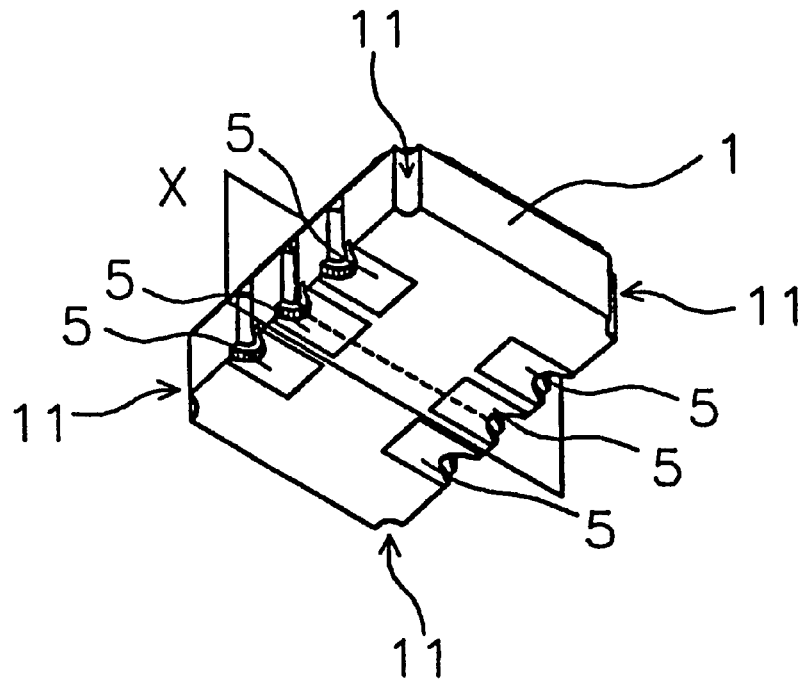
FIG. 2 shows a perspective bottom view of the package for electronic components according to one preferred embodiment of the present invention.
Figure 3:
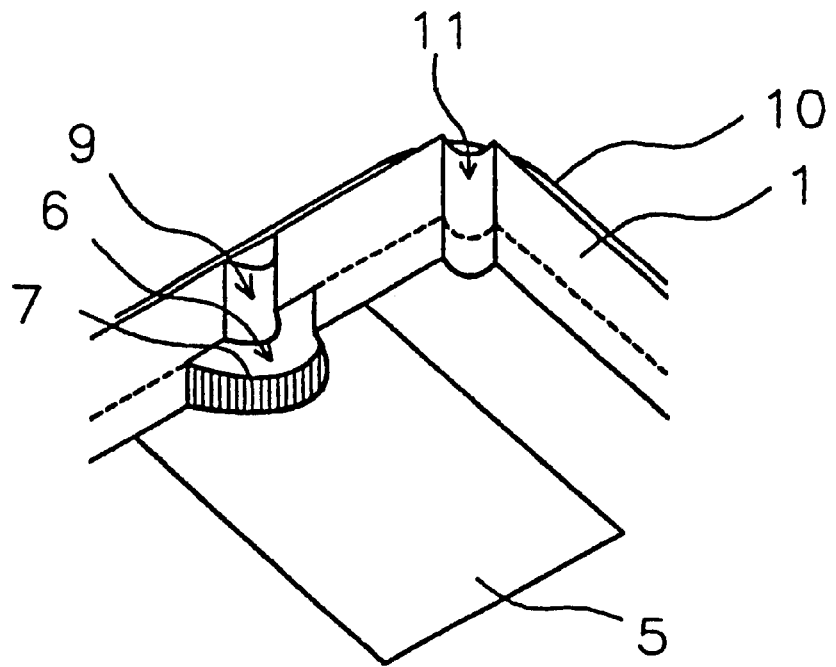
FIG. 3 shows a partially enlarged perspective view of the package for electronic components according to a preferred embodiment of the present invention.
Figure 4:
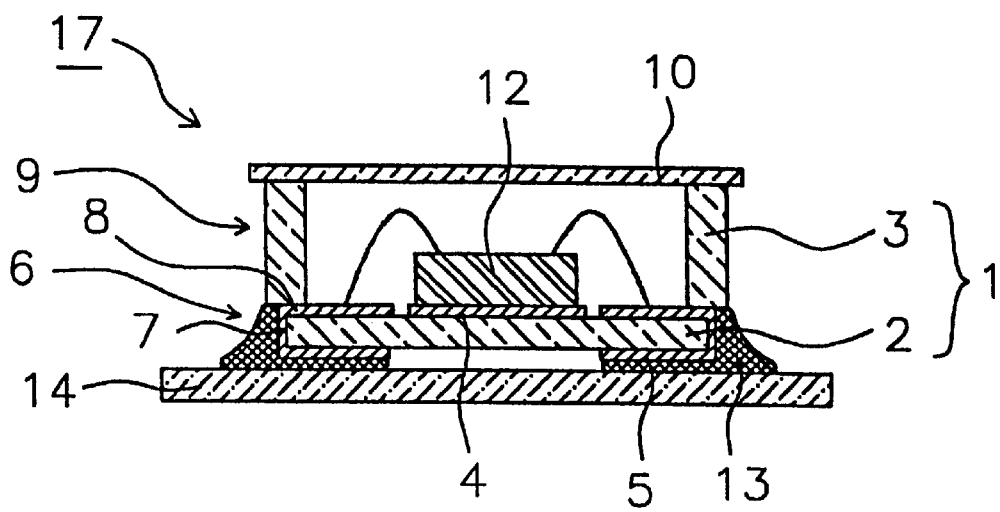
FIG. 4 shows a cross-section of the package for electronic components in a preferred embodiment of the present invention in which an electronic device element accommodated in the package is mounted on the circuit board and the package for electronic components in FIG. 4 is shown by a cross-section on the surface X in the package shown in FIG. 2.

One preferred embodiment of the present invention will be described with reference to FIGS. 1 to 4. FIG. 1, 2 and 3 show a disassembled perspective top view, a perspective bottom view and a partially enlarged perspective view, respectively, of the package according to preferred embodiments of the present invention. FIG. 4 shows an electronic component, in which an electronic device element is provided in the package according to a preferred embodiment of the present invention, mounted on the circuit board. FIG. 4 shows a cross section on the cross-sectional surface X of the package shown in FIG. 2.

The package 1 according to a preferred embodiment of the present invention preferably includes a base substrate 2 and a side wall 3. The side wall 3 preferably has a through-hole which provides a space arranged to receive an electronic element such as a surface acoustic wave element. The side wall 3 is provided on an upper surface of the base substrate 2. An electrode 4 (the area surrounded by the broken line in FIG. 1) is disposed on the element mounting surface i.e., an upper surface, and external electrodes 5 are disposed on the bottom surface of the base substrate 2. Recesses 6 are provided on the base substrate 2, and wiring layers (or conductive pattern) 7 are provided on the side surfaces of the recesses 6 provided on the base substrate 2. Recesses 9 are provided on portions of the side wall 3 which correspond to the recesses 6 provided on the base substrate 2, whereby the recess 6 and the recess 9 are connected with each other to define a communicating recess. Lead patterns 8 are provided on the upper surface of the base substrate 2 so as to be electrically connected to the electrode 4, and the electrode 4 is electrically connected to the external electrodes 5 through lead patterns 8 and the wiring layers 7.

One of the unique features of preferred embodiments of the present invention is that the shape of the recesses provided at the side surfaces of the package 1 differs from the shape of the recesses in the conventional package. The recesses 6 on the base substrate 2 to have a wider cross-sectional area than the cross-sectional area of the recesses 9 on the side wall standing on the base substrate in a direction that is substantially perpendicular to the base substrate 2. In other words, steps are provided between the recesses 6 on the base substrate and the recesses 9 on the side wall. When the shape of the recesses 6 is enlarged as described above, a contact area of the wiring layer 7 is sufficient to ensure an electrical continuity between the electrodes 5 on the bottom surface of the base substrate 2 and the electrode 4 on the element mounting surface.

The method for manufacturing the package is the same as in the conventional package. For example, an elastic surface wave element 12 is mounted on the element mounting surface of the package 1 as shown in FIG. 4, and the package is airtight-sealed with a lid 10 such as a metal plate. Any methods including a die-bond method, a wire-bond method and face-down method may be used for mounting the element 12. The electronic component 17 formed as described above is mounted on the surface of a printed circuit board 14 preferably by a reflow method using a solder paste. Solder fillets 13 are formed in the recesses 6. The area of the wiring layer provided in the recesses 6 can be increased by enlarging the cross-sectional area of the recesses 6, allowing impedance (particularly resistance) of this portion to be decreased.

Figure 7A:
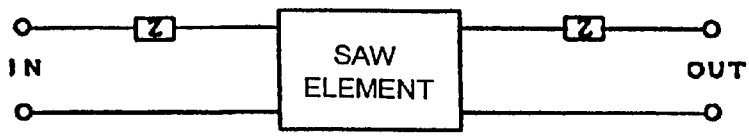
FIGS. 7A to 7C show circuit diagrams when an electronic device element is provided in the package for electronic components according to a preferred embodiment of the present invention.
Figure 8:
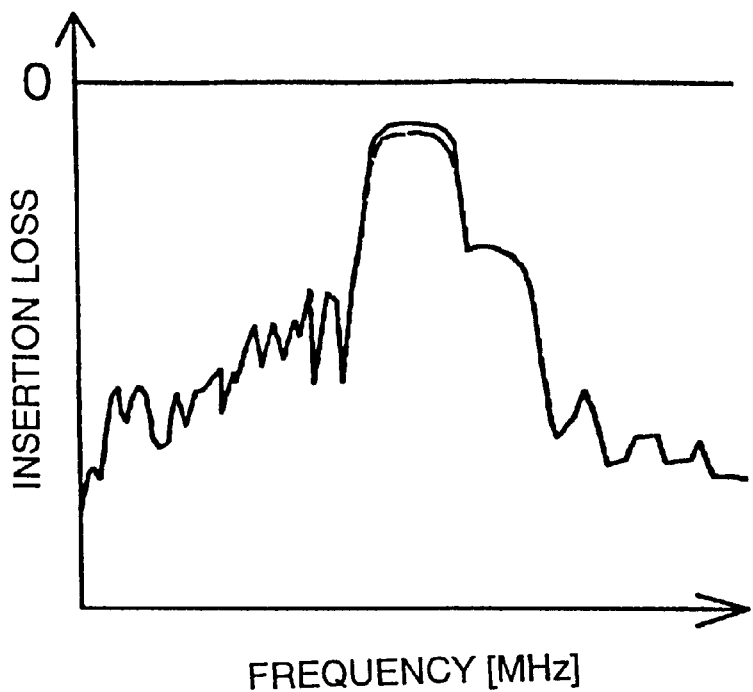
FIG. 8 shows electrical characteristics of the electronic component according to a preferred embodiment of the present invention.

Impedance Z (or resistance) is added in series in the circuitry as shown in FIG. 7A, when the external electrode terminals for input-output electrodes are configured as described in this preferred embodiment. However, insertion loss of the elastic surface acoustic wave element caused by providing the surface acoustic wave element in the package is reduced since the impedance Z is small, thereby deterioration of electrical characteristics can be prevented. FIG. 8 shows a comparison of the electrical characteristics of the conventional package and the package according to a preferred embodiment of the present invention. The broken line shows the electric characteristics of the elastic surface wave element using the conventional package, while the solid line shows the electric characteristics of the elastic surface wave element using the package according to a preferred embodiment of the present invention. The loss in the pass band is reduced as shown in the graph.

Figure 7B:
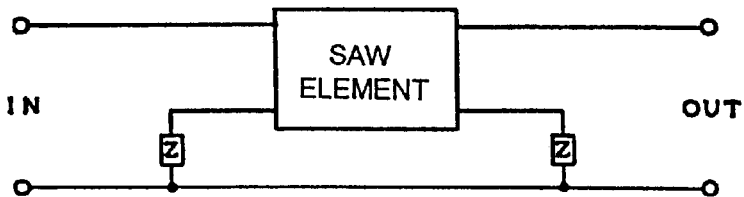
Figure 7C:
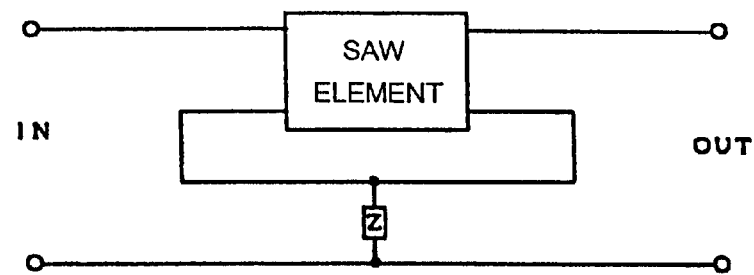
Figure 9:
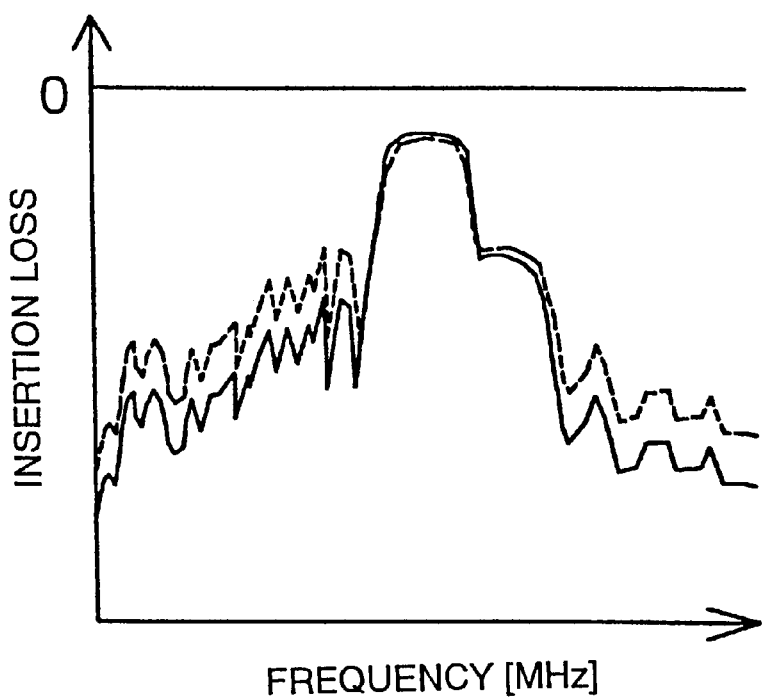
FIG. 9 shows electrical characteristics of the electronic component according to a preferred embodiment of the present invention.
Figure 10:
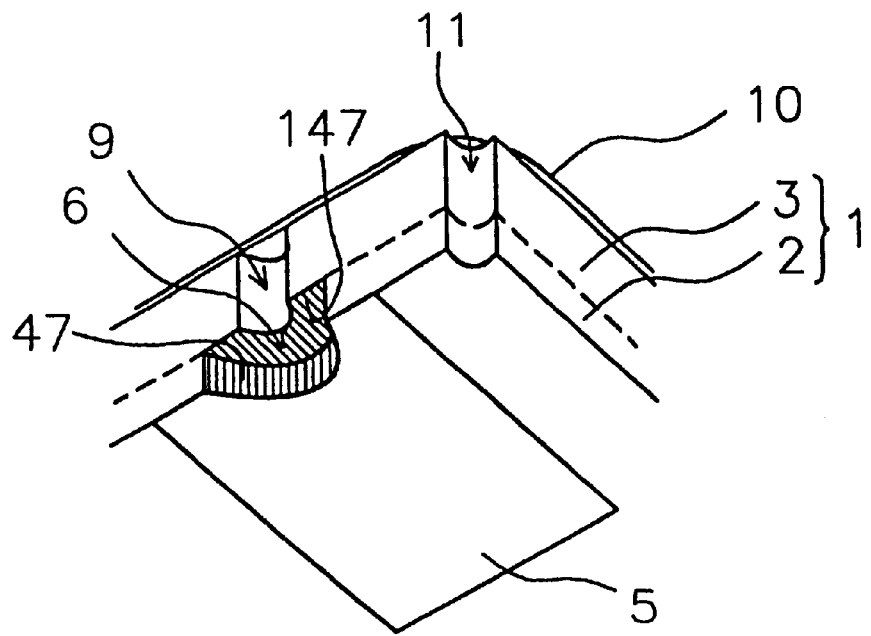
FIG. 10 shows a partially enlarged perspective view of the package for electronic components in a modified preferred embodiment of the present invention.

When the external electrode terminals for defining ground electrodes of the package are configured as shown in this preferred embodiment, impedance (or resistance) is added in the circuitry as shown in FIG. 7B and FIG. 7C. However, the insertion loss can be decreased and attenuation at the outside of the pass band can be increased, since the impedance Z is reduced while reducing the potential difference between the ground electrode of the elastic surface wave element to be connected to the package and the ground potential of the printed circuit board. FIG. 9 shows a comparison of the electrical characteristics in the conventional package and in the package according to a preferred embodiment of the present invention. The broken line and the solid line correspond to the electrical characteristics when the conventional package and the package according to a preferred embodiment of the present invention are used, respectively. It can be seen that loss within the pass band decreases while attenuation at the outside of the pass band increases.

Mechanical strength between the electronic component and the printed circuit board after mounting the electronic component on the printed circuit board is greatly improved by expanding the area of the wiring layers 7 provided in the recesses 6 as shown in FIG. 4 to increase the contact area between the wiring layer 7 and the fillet 13.

In addition, the recesses 9 on the side wall 3 preferably have a smaller cross-sectional area than the cross-sectional area of the recesses 6 on the base substrate 2. 47 Accordingly, the thickness $\underline{W}$ of the side wall 3 as a sealing width of the cap 10 can be ensured to a certain extent even at the narrowest portion $\underline{Wmin}$ to allow the package to be airtight.

Figure 5:
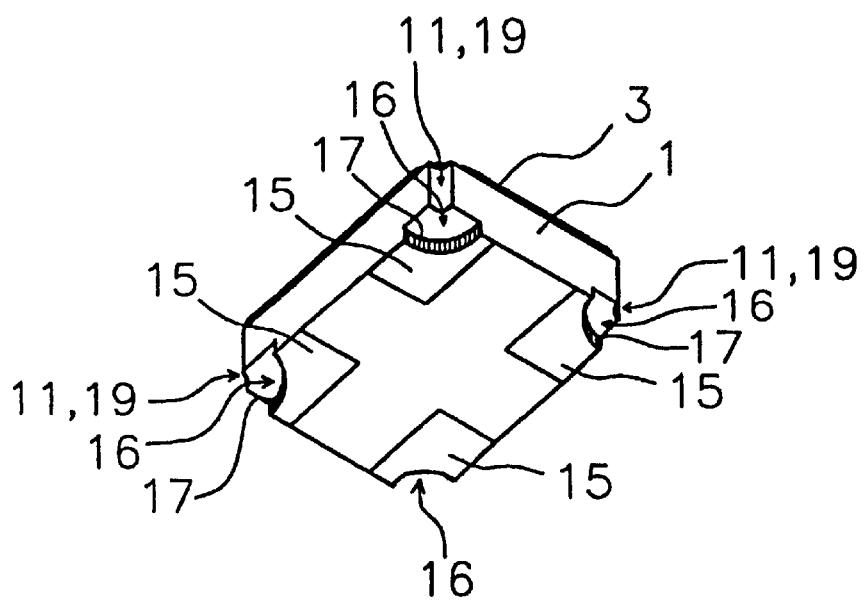
FIG. 5 shows a perspective bottom view of the package for electronic components in an another preferred embodiment of the present invention.
Figure 6:
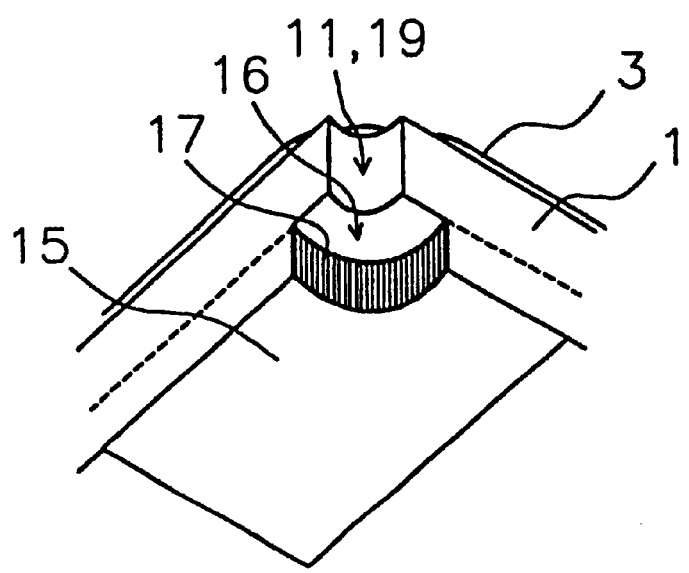
FIG. 6 shows a partially enlarged perspective view of the package for electronic components in an another preferred embodiment of the present invention.

The present invention can be applied to the package in which the external electrode terminals are provided at the corners of the package as shown in FIGS. 5 and 6. In addition, the wiring layers may be provided at the upper surface portion 147 of the recess 6, or at the bottom surface of the member constituting the side wall 3. Thus, the wiring layers are not only provided at the side surface portions 47 of the recesses 6 on the base substrate 2. The contact area between the wiring layer 47 and the solder fillet is further enlarged by allowing the area of the wiring layer to be very wide and have increased area, thereby allowing the strength of the electrical and mechanical continuity between the package and the circuit board to be greatly increased. The shape of the recess is not limited to the concentric circle as shown in FIGS. 4 and 6, but various shapes as shown in FIGS. 11 to 18 may be contemplated.

Figure 11:
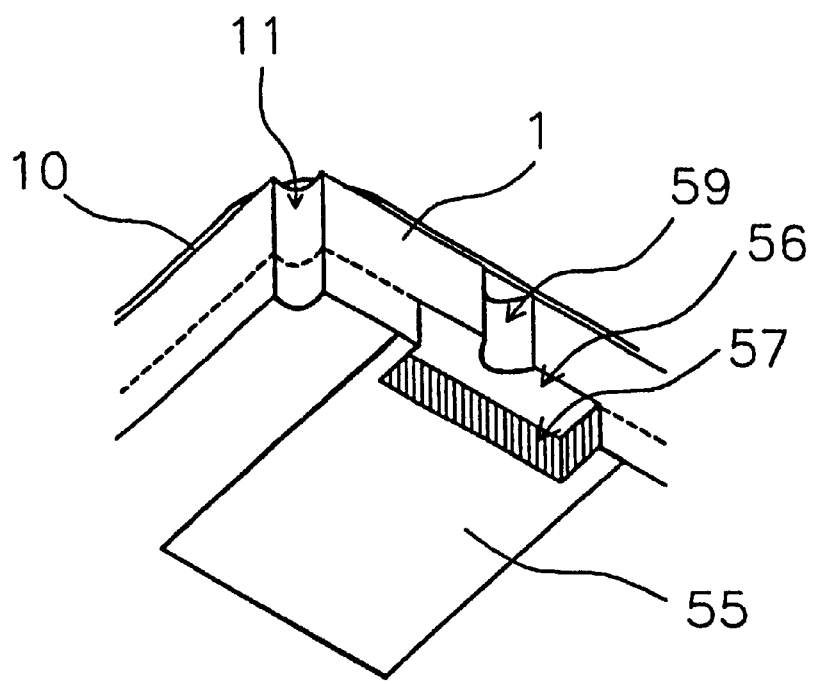
FIG. 11 shows a partially enlarged perspective view of the package for electronic components in a further modified preferred embodiment of the present invention.
Figure 12:
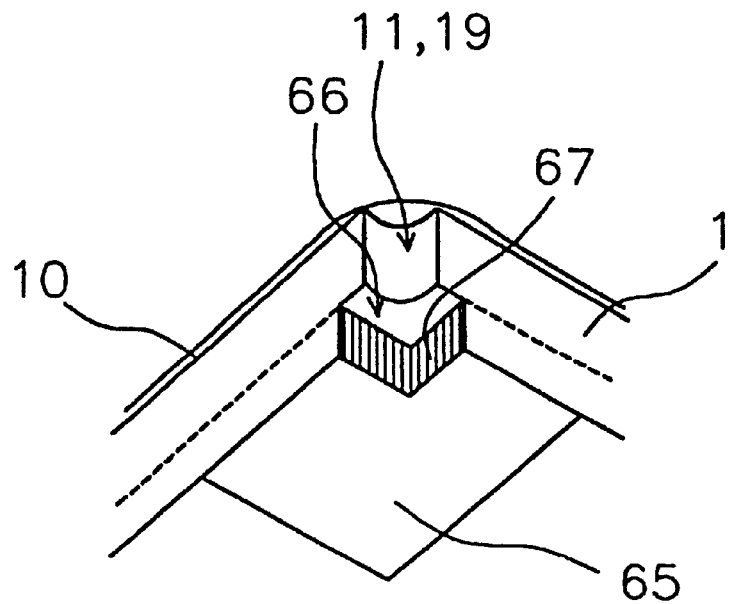
FIG. 12 shows a partially enlarged perspective view of the package for electronic components in a further modified preferred embodiment of the present invention.
Figure 13:
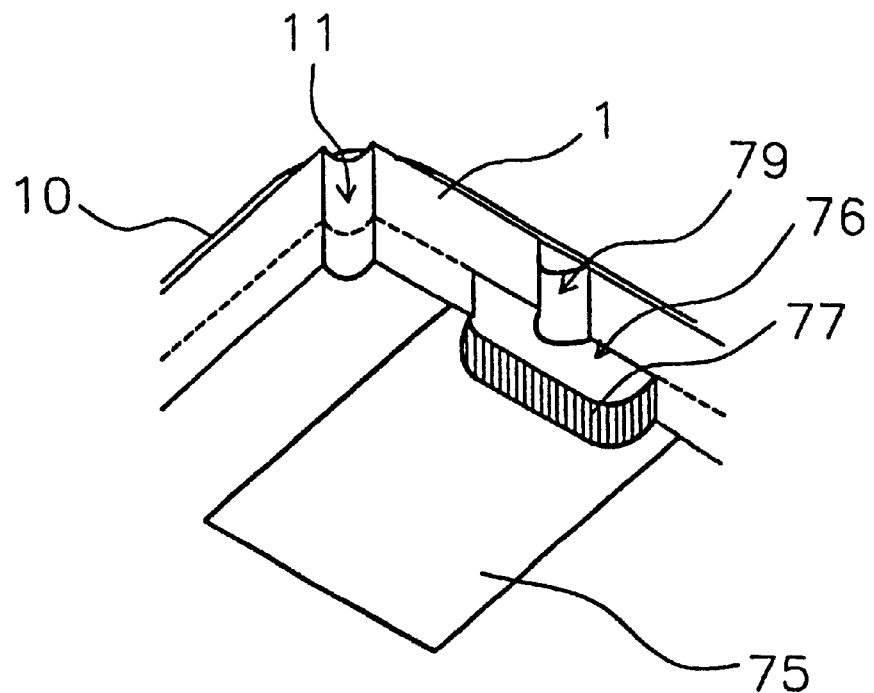
FIG. 13 shows a partially enlarged perspective view of the package for electronic components in a further modified preferred embodiment of the present invention.
Figure 14:
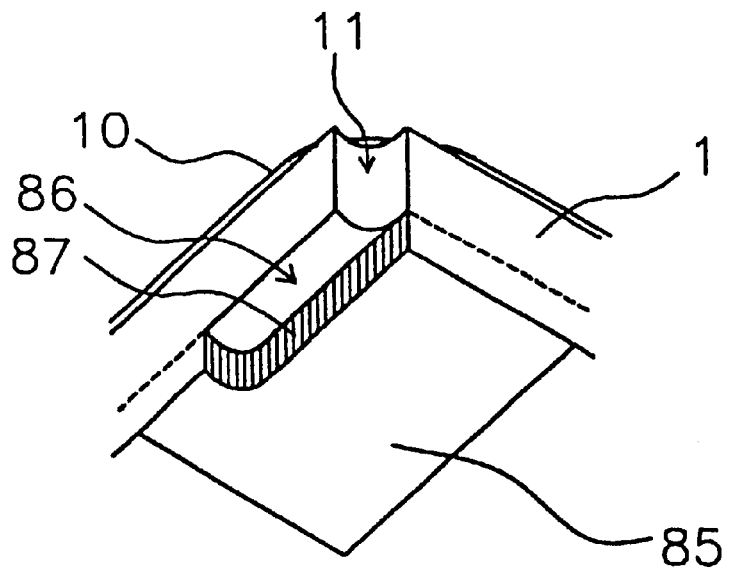
FIG. 14 shows a partially enlarged perspective view of the package for electronic components in a further modified preferred embodiment of the present invention.
Figure 15:
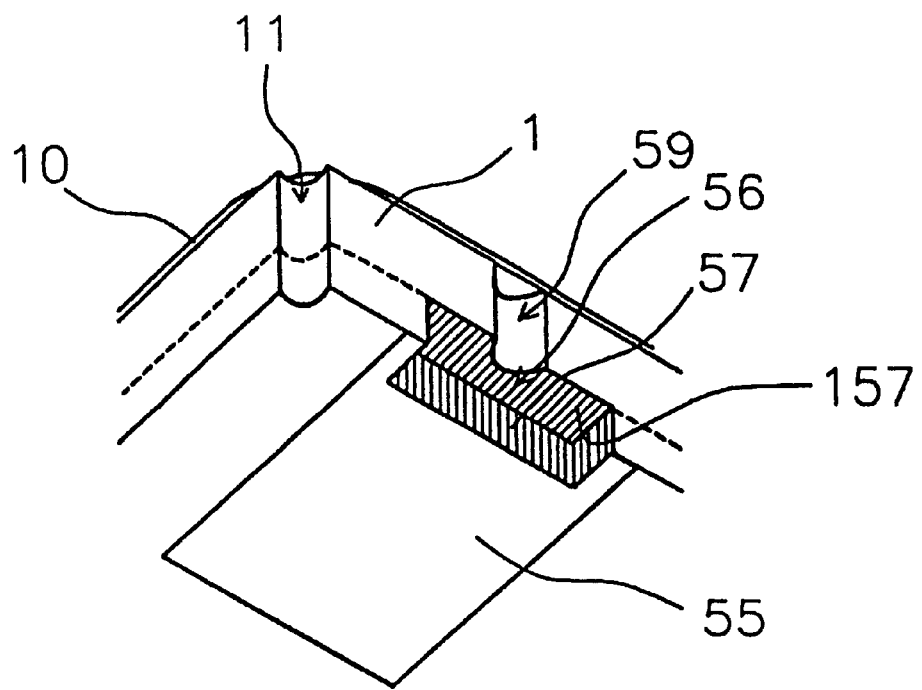
FIG. 15 shows a partially enlarged perspective view of the package for electronic components in a further modified preferred embodiment of the present invention.
Figure 16:
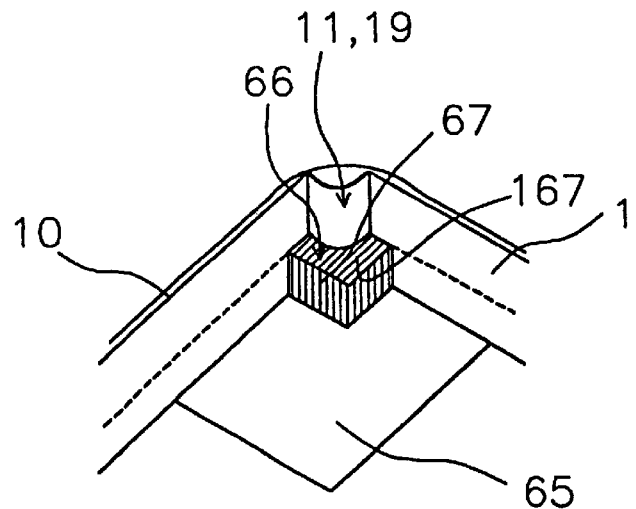
FIG. 16 shows a partially enlarged perspective view of the package for electronic components in a further modified preferred embodiment of the present invention.
Figure 17:
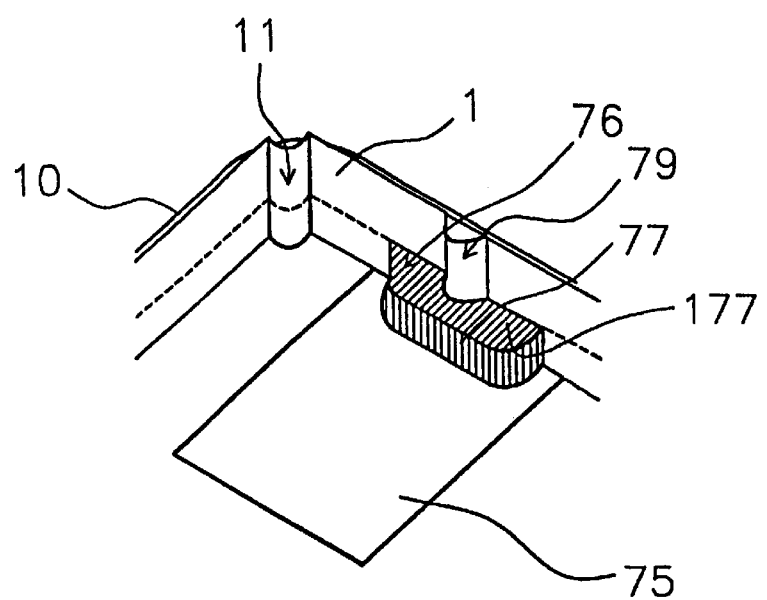
FIG. 17 shows a partially enlarged perspective view of the package for electronic components in a further modified preferred embodiment of the present invention.
Figure 18:
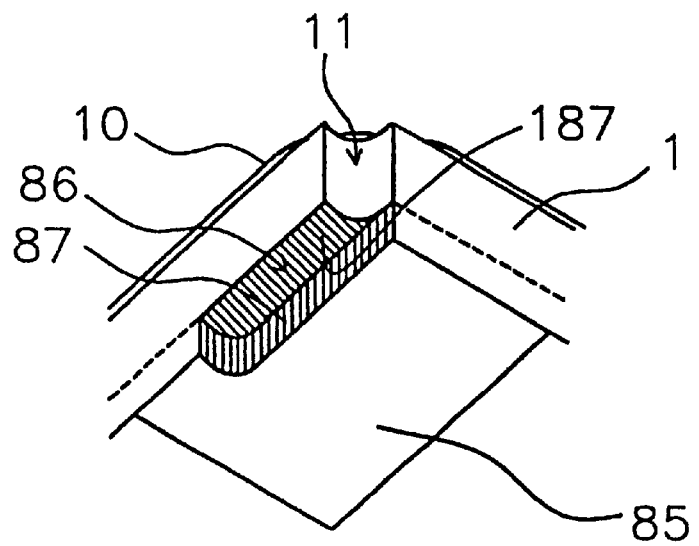
FIG. 18 shows a partially enlarged perspective view of the package for electronic components in a further modified preferred embodiment of the present invention.
Figure 19:
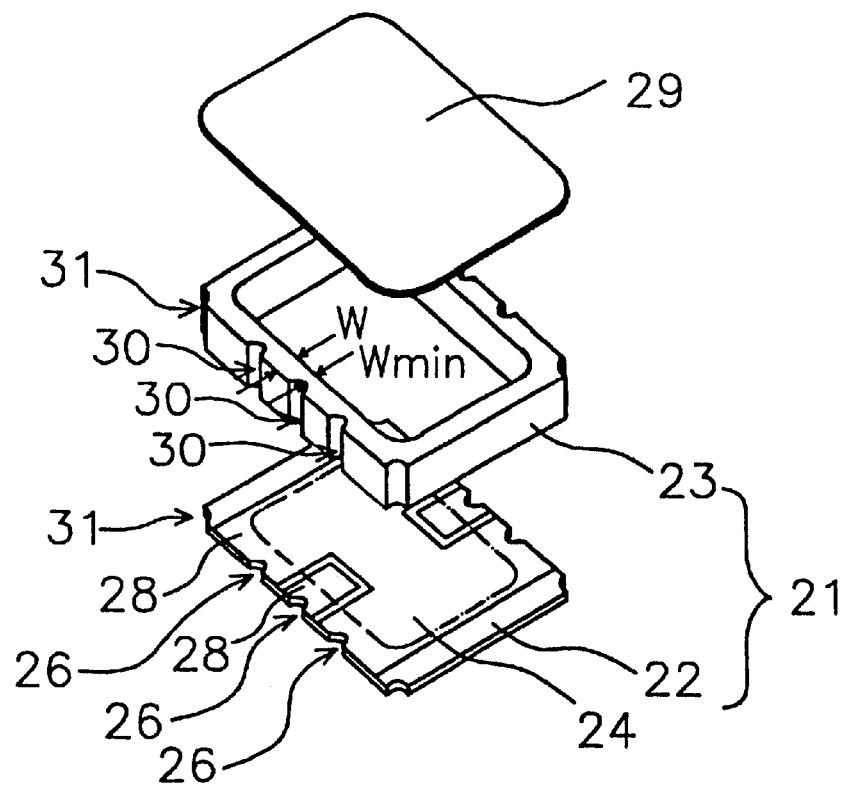
FIG. 19 shows a disassembled top view of the package for electronic components according to a conventional device.
Figure 20:
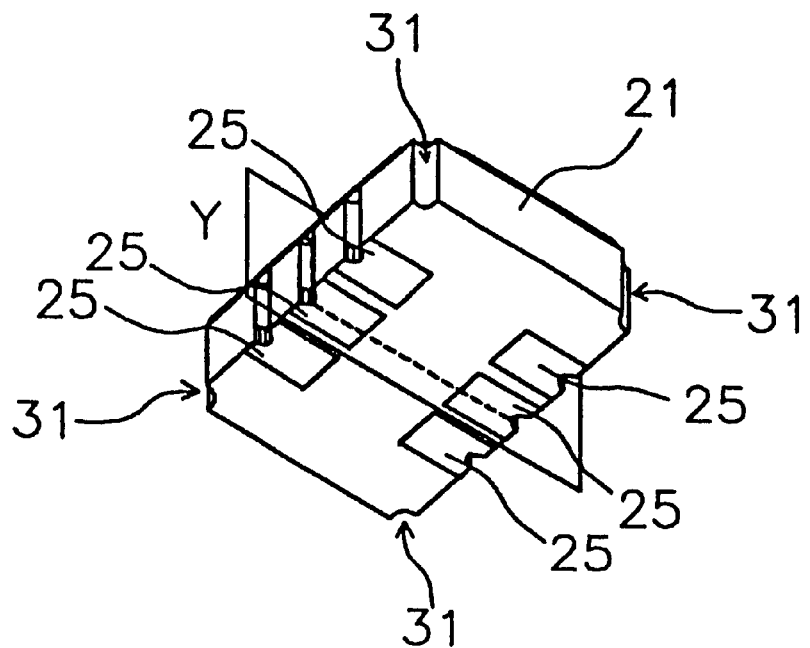
FIG. 20 shows a perspective bottom view of the package for electronic components according to a conventional device.
Figure 21:
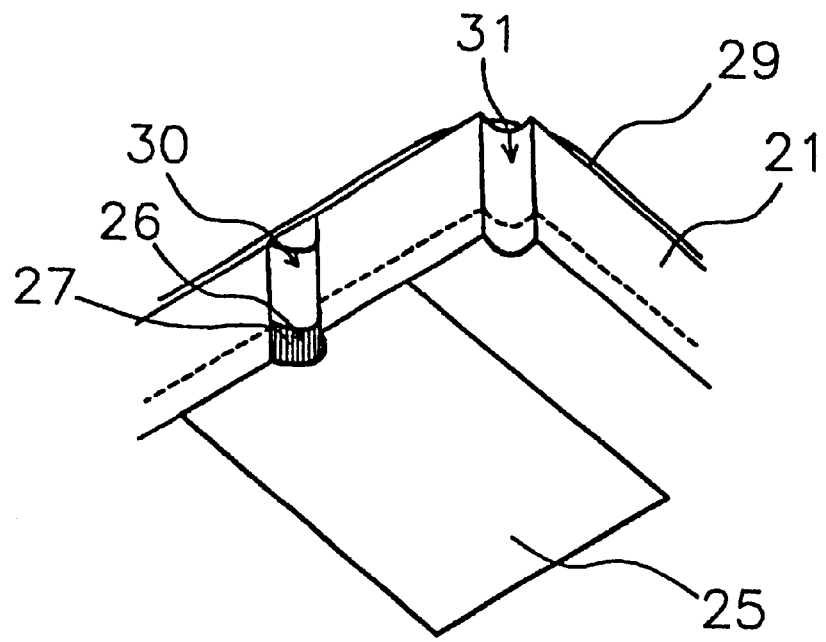
FIG. 21 shows a partially enlarged perspective view of the package for electronic components in one conventional embodiment.
Figure 22:
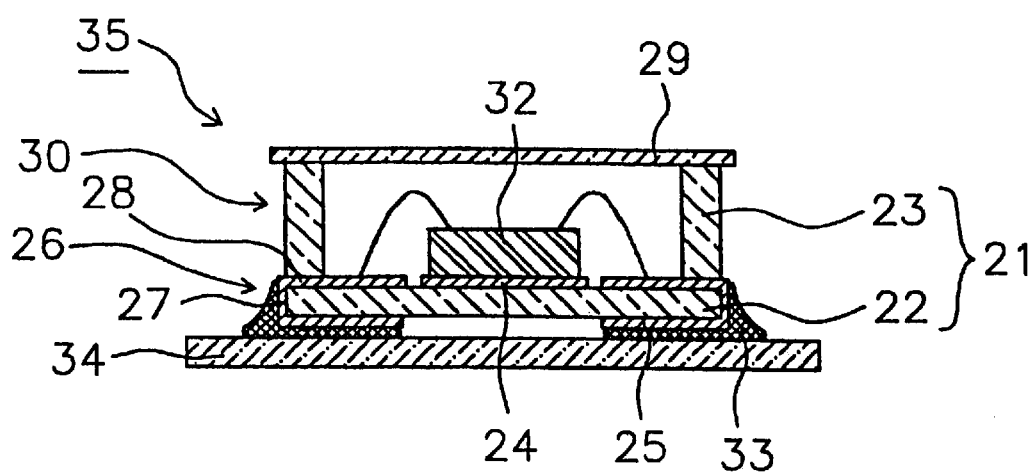
FIG. 22 shows a cross section of the package for electronic components in one embodiment of the present invention in which an electronic device element accommodated in the package is mounted on the circuit board. The package for electronic components in FIG. 22 is shown by a cross section on the face Y in the package shown in FIG. 20.

More specifically, the cross section of the recess 6 shown in FIGS. 1–3 has a sector or substantially semi-circular shape, but a recess 56 shown in FIG. 11 and a recess 56 shown in FIG. 15 has a substantially rectangular shape. The recess to be provided at the corner of the side wall of the base substrate may have a substantially V-shaped configuration as a recess 66 shown in FIG. 12 or FIG. 16. It is possible to make one or more of the corners of the substantially rectangular recess as a recess 76 shown in FIG. 13 or FIG. 17. A recess 86 shown in FIG. 14 is provided at the corner of the base substrate 1 and extends along one side wall of the base substrate 1. In theses recesses, the wiring layer may be provided at an upper surface portion 157 shown in FIG. 15 or FIG. 16, or an upper surface portion 177 shown in FIG. 17.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A package for electronic components comprising:
   a base substrate having at least one recess on a side surface thereof, the base substrate having electrodes on an upper surface and a bottom surface thereof and a conductive pattern arranged in the recess such that the electrode on the upper surface is electrically connected to the electrode on the bottom surface through the conductive pattern; and
   a side wall having a through-hole which defines a space adapted to receive an electronic element, the side wall having at least one recess on a side surface thereof and being provided on the base substrate such that the recess of the side wall is connected to the recess of the base substrate to define a communicating recess;
   wherein the recess of the base substrate has a cross-sectional area that is larger than the cross-sectional area of the recess of the side wall such that a portion of the side wall is exposed at the recess of the base substrate.

2. The package for electronic components according to claim 1, wherein the recess of the base substrate and the recess of the side wall are provided at a corner of the base substrate and the side wall, respectively.

3. The package for electronic components according to claim 1, wherein the recess of the base substrate exposes a portion of a bottom surface of the side wall and another conductive pattern is provided on the exposed portion of the bottom surface of the side wall.

4. The package for electronic components according to claim 1, further comprising lead patterns provided on the upper surface of the base substrate so as to be electrically connected to the electrode thereon.

5. The package for electronic components according to claim 1, wherein the package is sealed so as to be airtight.

6. The package for electronic components according to claim 1, further comprising external electrode terminals provided at the corners of the package.

7. The package for electronic components according to claim 1, wherein the conductive pattern includes wiring layers provided at the upper surface portion of the recess of the base substrate.

8. The package for electronic components according to claim 1, wherein the conductive pattern includes wiring layers provided at the bottom surface of the side wall.

9. The package for electronic components according to claim 1, wherein the recess of the side wall and the recess of the base substrate each has a shape that is one of a concentric circle, a sector, a substantially semi-circular shape, a substantially rectangular shape and a substantially V-shaped configuration.

10. An electronic component comprising:
    a package including:
      a base substrate having at least one recess on a side surface thereof, the base substrate having electrodes on an upper surface and a bottom surface thereof and a conductive pattern arranged in the recess such that the electrode on the upper surface is electrically connected to the electrode on the bottom surface through the conductive pattern; and
      a side wall having a through-hole which defines a space adapted to receive an electronic element, the side wall having at least one recess on a side surface thereof and being provided on the base substrate such that the recess of the side wall is connected to the recess of the base substrate to define a communication recess;
      wherein the recess of the base substrate has a cross-sectional area that is larger than the cross-sectional area of the recess of the side wall along a length direction of the side surface of the base substrate; and
    an electronic element disposed in the package.

11. The electronic component according to claim 10, wherein the electronic element is an elastic surface wave element.

12. The electronic component according to claim 10, wherein the recess of the base substrate and the recess of the side wall are provided at a corner of the base substrate and the side wall, respectively.

13. The electronic component according to claim 10, wherein the recess of the base substrate exposes a portion of a bottom surface of the side wall and another conductive pattern is provided on the exposed portion of the bottom surface of the side wall.

14. The electronic component according to claim 10, further comprising lead patterns provided on the upper surface of the base substrate so as to be electrically connected to the electrode thereon.

15. The electronic component according to claim 10, wherein the package is sealed so as to be airtight.

16. The electronic component according to claim 10, further comprising external electrode terminals provided at the corners of the package.

17. The electronic component according to claim 10, wherein the conductive pattern includes wiring layers provided at the upper surface portion of the recess of the base substrate.

18. The electronic component according to claim 10, wherein the conductive pattern includes wiring layers provided at the bottom surface of the side wall.

19. The electronic component according to claim 10, wherein the recess of the side wall and the recess of the base substrate each has a shape that is one of a concentric circle, a sector, a substantially semi-circular shape, a substantially rectangular shape and a substantially V-shaped configuration.

* * * * *